United States Patent
Hong

(10) Patent No.: US 11,897,007 B2
(45) Date of Patent: Feb. 13, 2024

(54) APPARATUS AND METHOD FOR PROCESSING SUBSTRATE

(71) Applicant: SEMES CO., LTD., Chungcheongnam-do (KR)

(72) Inventor: Yun Hwa Hong, Incheon (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 17/832,573

(22) Filed: Jun. 4, 2022

(65) Prior Publication Data
US 2023/0115670 A1    Apr. 13, 2023

(30) Foreign Application Priority Data
Oct. 8, 2021   (KR) .................. 10-2021-0134176

(51) Int. Cl.
| | |
|---|---|
| *B08B 3/08* | (2006.01) |
| *H01L 21/67* | (2006.01) |
| *B08B 3/02* | (2006.01) |
| *B08B 3/04* | (2006.01) |

(52) U.S. Cl.
CPC .............. *B08B 3/022* (2013.01); *B08B 3/041* (2013.01); *B08B 3/08* (2013.01); *B08B 2203/0264* (2013.01); *H01L 21/67051* (2013.01)

(58) Field of Classification Search
None
See application file for complete search history.

(56) References Cited

U.S. PATENT DOCUMENTS

| | | | | |
|---|---|---|---|---|
| 2005/0178321 A1* | 8/2005 | Nguyen | ............ | H01L 21/67051 118/52 |
| 2009/0293914 A1* | 12/2009 | Aratake | ............ | H01L 21/67051 134/33 |
| 2012/0180828 A1* | 7/2012 | Higashijima | ........... | B08B 3/041 134/198 |
| 2012/0180829 A1* | 7/2012 | Higashijima | ........... | B08B 3/041 134/198 |
| 2013/0269737 A1* | 10/2013 | Mizuno | ............. | H01L 21/02041 134/157 |

(Continued)

FOREIGN PATENT DOCUMENTS

| | | |
|---|---|---|
| KR | 10-2014-0065343 | 5/2014 |
| KR | 10-2015-0004074 | 1/2015 |

(Continued)

*Primary Examiner* — Michael E Barr
*Assistant Examiner* — Omair Chaudhri
(74) *Attorney, Agent, or Firm* — Ladas & Parry, LLP

(57) ABSTRACT

Provided is an apparatus for processing a substrate. The apparatus for processing a substrate includes a base portion configured to provide a rotational force in a circumferential direction; a holding module located on the base portion and configured to hold the substrate; a nozzle module located above the base portion and configured to jet a chemical liquid onto the substrate on the holding module; and a scattering prevention module located on the base portion at a peripheral portion of the holding module and configured to, when the chemical liquid is scattered after being jetted onto the substrate, guide the scattered chemical liquid to be discharged, wherein the scattering prevention module guides the scattered chemical liquid with a variable movement caused by the rotational force.

16 Claims, 6 Drawing Sheets

(56) References Cited

U.S. PATENT DOCUMENTS

| | | | | |
|---|---|---|---|---|
| 2014/0014134 | A1* | 1/2014 | Ogata | B08B 13/00 |
| | | | | 134/104.1 |
| 2014/0026927 | A1* | 1/2014 | Ogata | H01L 21/67051 |
| | | | | 134/104.2 |
| 2014/0248774 | A1* | 9/2014 | Aiura | H01L 21/02076 |
| | | | | 438/690 |
| 2015/0090305 | A1* | 4/2015 | Wakiyama | H01L 21/67051 |
| | | | | 134/153 |
| 2015/0114561 | A1* | 4/2015 | Higashijima | H01L 21/6715 |
| | | | | 156/345.23 |
| 2015/0187613 | A1* | 7/2015 | Wakiyama | H01L 21/6715 |
| | | | | 134/95.1 |
| 2016/0111302 | A1* | 4/2016 | Kahlon | H01L 21/67051 |
| | | | | 134/33 |
| 2017/0186601 | A1* | 6/2017 | Ikeda | H01L 21/02057 |
| 2017/0200624 | A1* | 7/2017 | Higashijima | H01L 21/67051 |
| 2018/0221925 | A1* | 8/2018 | Ito | B08B 3/02 |
| 2020/0105550 | A1* | 4/2020 | Morikawa | H01L 21/67023 |
| 2020/0107404 | A1* | 4/2020 | Morita | H05B 3/283 |
| 2021/0134590 | A1* | 5/2021 | Kosai | C11D 7/08 |
| 2021/0343576 | A1* | 11/2021 | Ikeda | H01L 21/67051 |
| 2022/0056590 | A1* | 2/2022 | Morita | H01L 21/67248 |
| 2022/0130691 | A1* | 4/2022 | Tachibana | H01L 21/67248 |
| 2022/0154342 | A1* | 5/2022 | Morikawa | H01L 21/02068 |
| 2022/0362813 | A1* | 11/2022 | Nakashoya | H01L 21/67017 |

FOREIGN PATENT DOCUMENTS

| | | |
|---|---|---|
| KR | 10-1545450 | 8/2015 |
| KR | 20-0493229 | 2/2021 |

* cited by examiner

[Fig. 1]
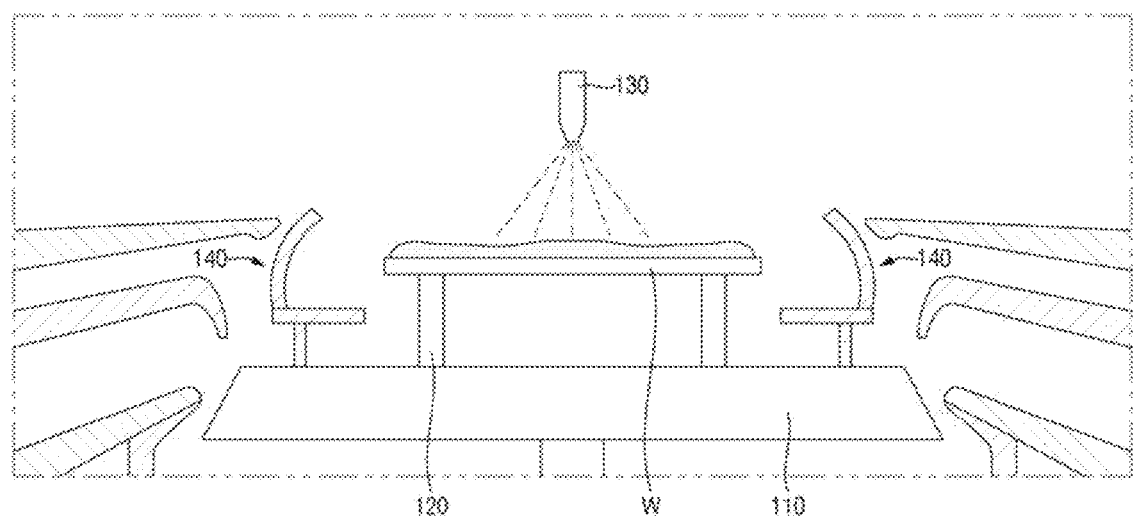

[Fig. 2]
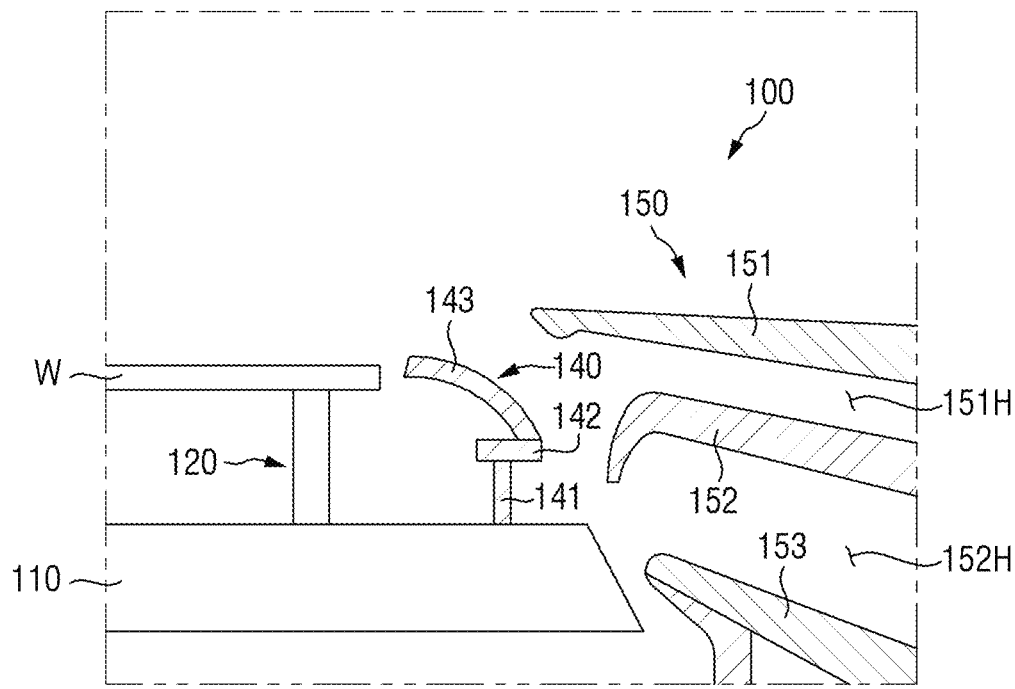
[Fig. 3]
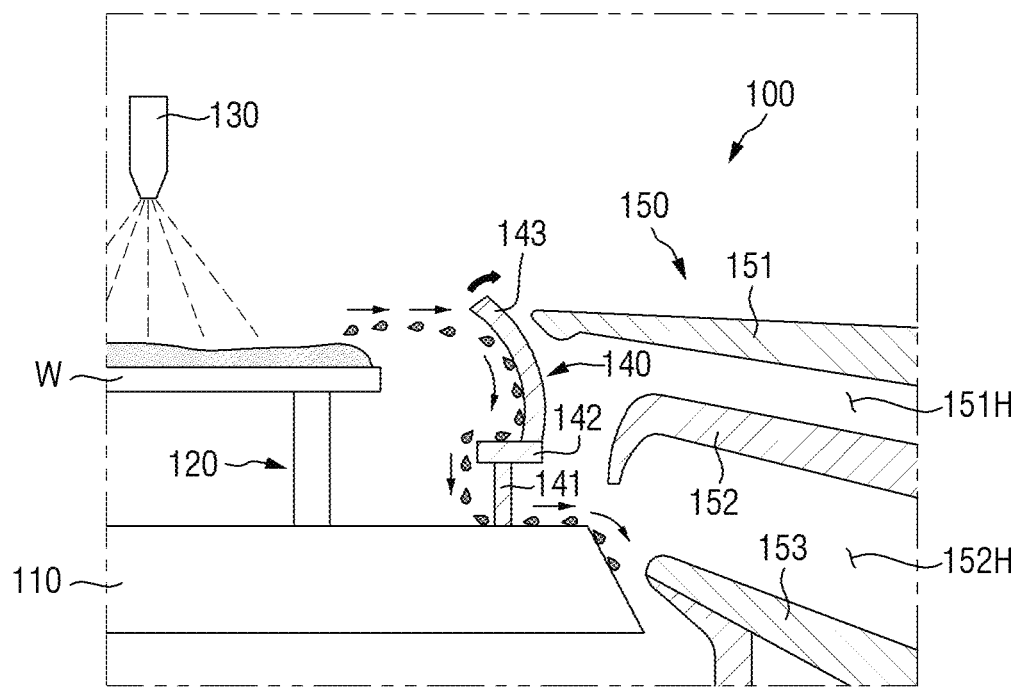

[Fig. 4]
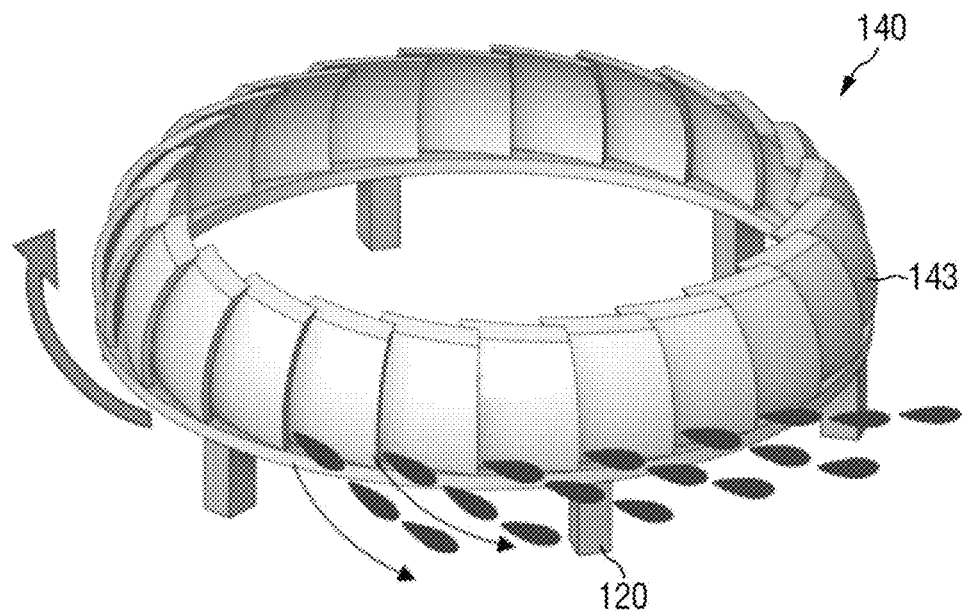
[Fig. 5]
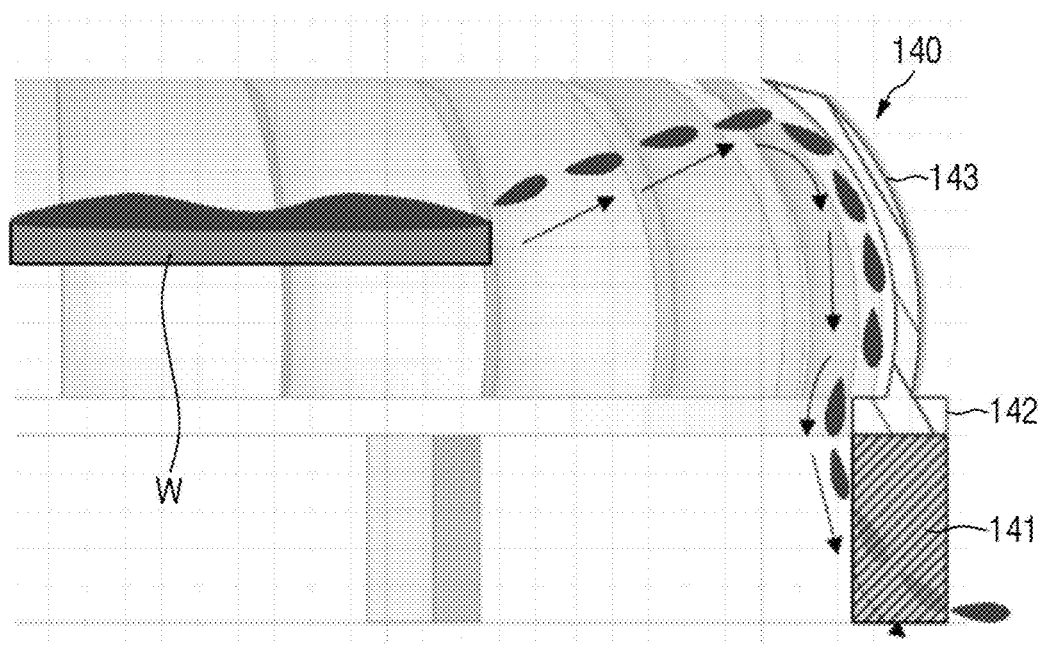

[Fig. 6]
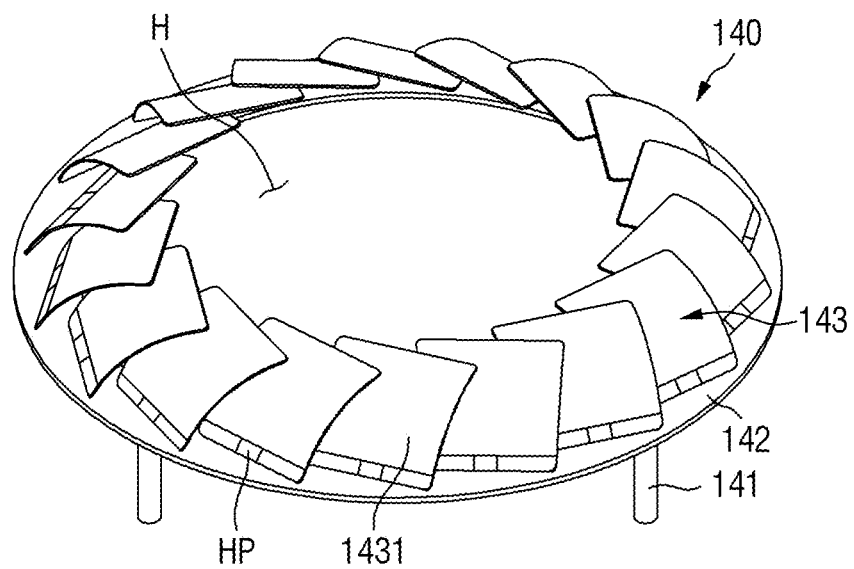
[Fig. 7]
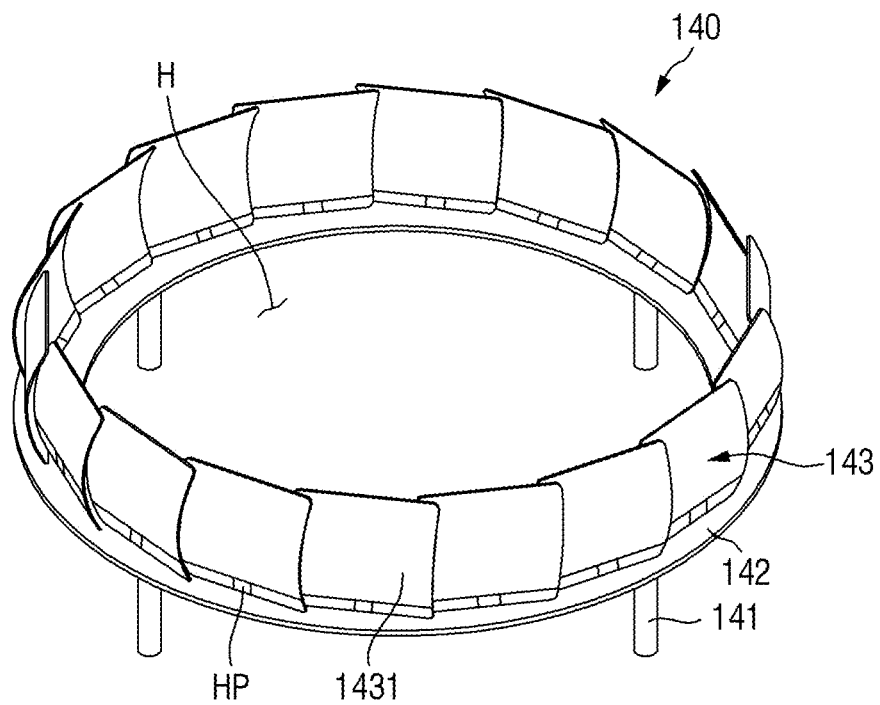

[Fig. 8]
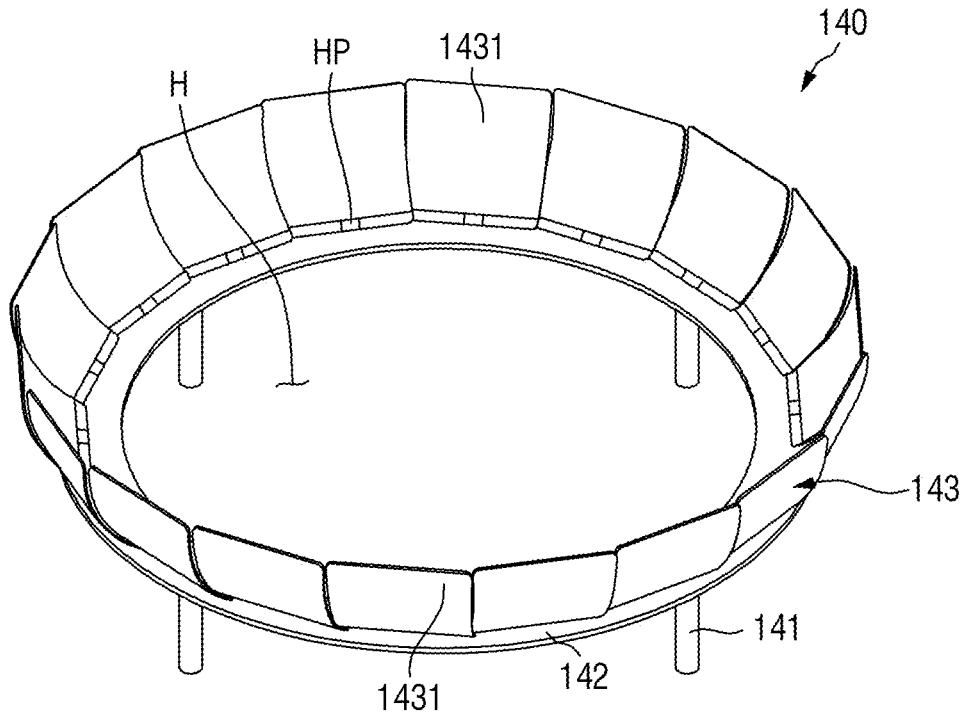
[Fig. 9]
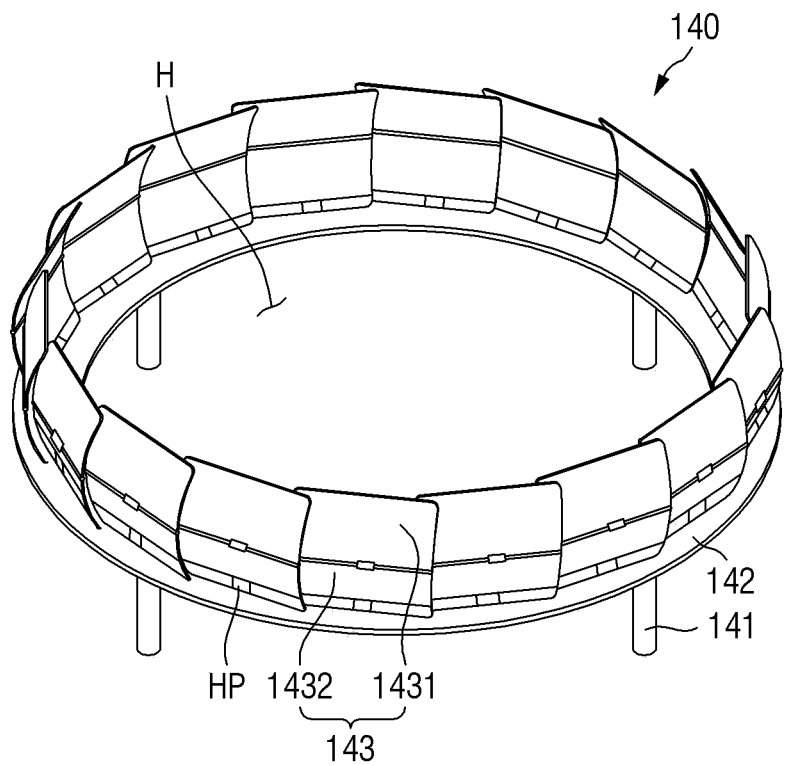

[Fig. 10]
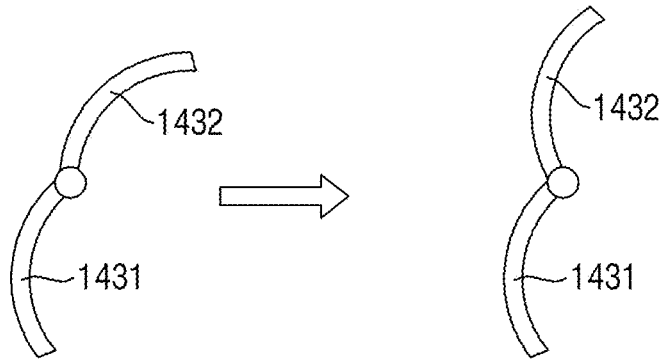
[Fig. 11]
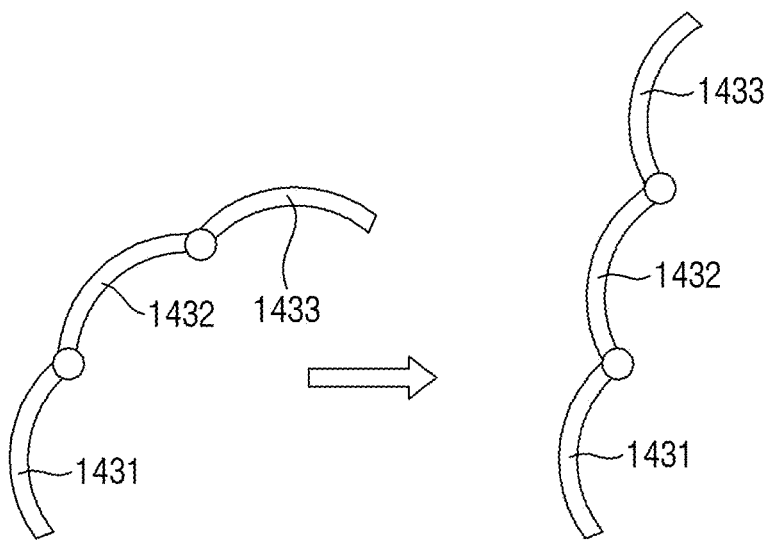
[Fig. 12]
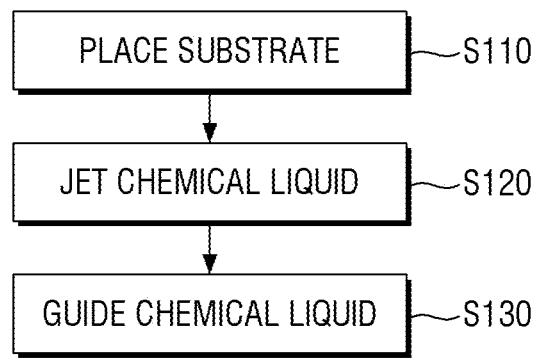

APPARATUS AND METHOD FOR PROCESSING SUBSTRATE

CROSS-REFERENCE TO RELATED APPLICATION

This application claims priority from Korean Patent Application No. 10-2021-0134176 filed on Oct. 8, 2021 in the Korean Intellectual Property Office, and all the benefits accruing therefrom under 35 U.S.C. 119, the contents of which in their entirety are herein incorporated by reference.

BACKGROUND

1. Technical Field

The present disclosure relates to an apparatus and method for processing a substrate.

2. Description of the Related Art

In a process of processing a substrate, it is necessary to efficiently process a chemical liquid scattered from the substrate. In particular, a degree to which the chemical liquid is scattered may be changed according to a degree of rotation of the substrate. Thus, in consideration of this fact, it is necessary to actively prevent the scattering of the chemical liquid and to guide and discharge the processing liquid. Further, it is necessary to avoid complicated structure or an increase in manufacturing cost while meeting such needs.

SUMMARY

Aspects of the present disclosure provide an apparatus for processing a substrate which is capable of efficiently processing a chemical liquid scattered from a substrate in a process of processing the substrate.

Aspects of the present disclosure also provide an apparatus for processing a substrate which is provided with a means capable of actively responding to the scattering of a liquid chemical in each state, such as an initial rotation state of a substrate, an accelerated rotation state of the substrate, a state in which the substrate reaches a target rotation speed, and the like.

Aspects of the present disclosure also provide an apparatus for processing a substrate which is capable of preventing the scattering of a chemical liquid by the active response, as well as taking into account a direction in which the chemical liquid is discharged, a position at which the liquid chemical is collected, and the like.

Aspects of the present disclosure also provide an apparatus for processing a substrate which is capable of variably moving at various angles according to characteristics, such as a degree, type, and the like of scattering of a chemical liquid.

Aspects of the present disclosure also provide an apparatus for processing a substrate which is implemented to respond in various ways to scattering of a chemical liquid by having a foldable structure so that the speed and rotation angle of variable movement can be taken into account when the variable movement is performed.

Aspects of the present disclosure also provide an apparatus for processing a substrate which is capable of avoiding complicated structure or an increase in installation cost while meeting these needs.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided an apparatus for processing a substrate including: a base portion configured to provide a rotational force in a circumferential direction; a holding module located on the base portion and configured to hold the substrate; a nozzle module located above the base portion and configured to jet a chemical liquid onto the substrate on the holding module; and a scattering prevention module located on the base portion at a peripheral portion of the holding module and configured to, when the chemical liquid is scattered after being jetted onto the substrate, guide the scattered chemical liquid to be discharged, wherein the scattering prevention module guides the scattered chemical liquid with a variable movement caused by the rotational force.

In addition, the scattering prevention module may include a support portion provided on the base portion, a body portion provided on the peripheral portion of the holding module via the support portion, and a movable portion provided at an upper portion of the body portion and configured to perform the variable movement.

In addition, the movable portion may perform the variable movement that is based on rotation between the internal side and the outer side of the body portion.

Also, the movable portion may guide the chemical liquid scattered from the substrate by performing the variable movement based on the centrifugal force.

In addition, the degree to which the chemical liquid is scattered from the substrate W may be increased in response to the rotation speed of the base portion, and the degree of the variable movement of the movable portion may be increased in response to the rotation speed of the base portion.

In addition, the movable portion of the scattering prevention module may be formed in a shape rounded outwardly.

In addition, the movable portion may include a first movable member directly interlocked with the base portion, and a second movable member rotatably provided at an upper portion of the first movable member and configured to perform the variable movement based on the centrifugal force.

In addition, the movable portion may include a third movable member rotatably provided at an upper portion of the second movable member and configured to perform the variable movement based on the centrifugal force.

In addition, the apparatus may further include a bowl located in the peripheral portion of the base portion and configured to accommodate the chemical liquid scattered from the substrate, and the scattering prevention module may be located between the holding module and the bowl.

In addition, the bowl may include a first bowl, a second bowl located having a first gap with the first bowl, and a third bowl located having a second gap with the second bowl, and the scattering prevention module may allow the chemical liquid scattered from the substrate to flow into one of the first gap and the second gap, or may guide the chemical liquid to flow to a separate location other than the bowl.

In addition, the movable portion may be provided as a plurality of neighboring piece-shaped members on the body portion.

In addition, the neighboring piece-shaped members of the movable portion may be arranged at least partially overlapping each other and perform the variable movement.

In addition, the support portion may be provided in plurality at a lower portion of the body portion and the chemical liquid guided by the movable portion may be discharged to pass through the body portion and the base portion.

According to another aspect of the present disclosure, there is provided an apparatus for processing a substrate including: a base portion capable of horizontal rotation; a holding module located on the base portion and configured to hold a substrate; a nozzle module located above the base portion and configured to jet a chemical liquid onto the substrate on the holding module; and a scattering prevention module located on the base portion at a peripheral portion of the holding module and configured to, when the chemical liquid is scattered after being jetted onto the substrate, guide the scattered chemical liquid to be discharged, wherein the scattering prevention module guides the chemical liquid with a variable movement caused by a centrifugal force due to the horizontal rotation, the scattering prevention module includes a support portion supported on the base portion, a body portion provided on the peripheral portion of the holding module via the support portion, and a movable portion provided at an upper portion of the body portion and configured to perform the variable movement, the movable portion suppresses guiding of the chemical liquid scattered from the substrate by performing the variable movement based on rotation between an internal side and an outer side of the body portion and the centrifugal force, wherein a degree to which the chemical liquid is scattered from the substrate is increased in response to a rotation speed of the base portion, a degree of the variable movement of the movable portion is increased in response to the rotation speed of the base portion, the movable portion is formed in a shape rounded outwardly, the movable portion further includes a first move member directly interlocked with the base portion and a second movable member rotatably provided at an upper portion of the first movable member and configured to perform the variable movement based on the centrifugal force, and the movable portion includes a third movable member rotatably provided at an upper portion of the second movable member and configured to perform the variable movement based on the centrifugal force.

According to another aspect of the present disclosure, there is provided a method of processing a substrate including: placing a substrate on a holding module located on a base portion; jetting, by a nozzle module located above the base portion, a chemical liquid onto the substrate on the holding module; guiding, by a scattering prevention module located on the base portion at a peripheral portion of the holding module, the chemical liquid scattered from the substrate to be discharged, wherein the scattering prevention module guides the scattered chemical liquid based on a variable movement from an internal side to an outer side caused by a centrifugal force due to rotation of the base portion.

BRIEF DESCRIPTION OF THE DRAWINGS

The above and other aspects and features of the present disclosure will become more apparent by describing in detail exemplary embodiments thereof with reference to the attached drawings, in which:

FIG. 1 is a diagram illustrating a configuration of an apparatus for processing a substrate according to an embodiment of the present disclosure;

FIGS. 2 to 5 are diagrams illustrating a configuration according to a process of processing a substrate of FIG. 1;

FIGS. 6 to 8 are diagrams illustrating an operation state of a scattering prevention module of FIG. 1;

FIG. 9 is a diagram illustrating a configuration of an apparatus for processing a substrate according to another embodiment of the present disclosure;

FIG. 10 is a schematic diagram illustrating an operation state of a scattering prevention module of FIG. 9;

FIG. 11 is a schematic diagram illustrating an operation of an apparatus for processing a substrate according to another embodiment of the present disclosure; and FIG. 12 is a flowchart illustrating a method of processing a substrate according to an embodiment of the present disclosure.

DETAILED DESCRIPTION OF THE EMBODIMENTS

Hereinafter, preferred embodiments of the present disclosure will be described in detail with reference to the accompanying drawings. Advantages and features of the present disclosure and methods of accomplishing the same may be understood more readily by reference to the following detailed description of preferred embodiments and the accompanying drawings. The present disclosure may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, and/or elements. Unless defined otherwise, all technical and scientific terms used herein have the same meaning as commonly understood by one of ordinary skill in the art to which this invention belongs. Further, unless defined otherwise, all terms defined in generally used dictionaries may not be overly interpreted.

Hereinafter, exemplary embodiments of the present disclosure will be described in detail with reference to the accompanying drawings. In the description with reference to the drawings, the same or corresponding elements are denoted by the same reference numerals, and a redundant description thereof will be omitted.

Referring to FIG. 1, an apparatus 100 for processing a substrate according to an embodiment of the present disclosure includes a base portion 110, a holding module 120, a nozzle module 130, a scattering prevention module 140, and a bowl 150.

Here, the scattering prevention module 140 includes a support portion 141, a body portion 142, and a movable portion 143. The bowl 150 includes a first bowl 151, a second bowl 152, and a third bowl 153.

The base portion 110 rotates in a circumferential direction or provides a rotational force in a circumferential direction. That is, the base portion 110 may provide a rotational force to a substrate W, or may provide a rotational force to the scattering prevention module 140 through the support portion 141. That is, the base portion 110 may be implemented by a first method in which the base portion 110 itself rotates in the circumferential direction, and by a second method in which the base portion 110 provides a rotational force such that the substrate W and the scattering prevention module 140 ultimately rotate in the circumferential direction.

Further, the holding module 120 is located on the base portion 110 and holds the substrate W. The holding module 120 may allow the substrate to rotate together with the base portion 110 in the circumferential direction.

The nozzle module 130 is located above the base portion 110 and jets a chemical liquid onto the substrate W on the holding module 120. The chemical liquid may be jetted at a set position on the substrate with a set intensity. When the nozzle module 130 jets the chemical liquid, the scattering prevention module 140 may also be taken into account and the setting conditions of the nozzle module 130 and the scattering prevention module 140 may be changed.

Here, the scattering prevention module 140 may be located on the base portion 110 in a peripheral portion of the holding module 120. When the liquid chemical is scattered after being jetted onto the substrate W, the scattering prevention module 140 may guide the scattered chemical liquid to be discharged.

Referring to FIGS. 2 to 3, the scattering prevention module 140 guides the scattered chemical liquid with a variable movement caused by the rotational force rather than being in a fixed stationary state. The support portion 141 of the scattering prevention module 140 is provided in a bar shape on the base portion 110.

The body portion 142 of the scattering prevention module 140 is provided on the peripheral portion of the holding module 120 via the support portion 141. The body portion 142 may be continuously or discontinuously provided on the peripheral portion, but it is preferable that the body portion 142 is continuously provided in consideration of stability and durability of operation.

Meanwhile, the support portion 141 is provided in plurality at a lower portion of the body portion 142. The chemical liquid guided by the movable portion 143 is discharged to pass through at least the body portion 142 and the base portion 110.

The movable portion 143 of the scattering prevention module 140 is provided at an upper portion of the body portion 142. The movable portion 143 is interlocked with the body portion 142 and performs the variable movement.

Referring to FIGS. 3 to 5, the base portion 110 may rotate in the circumferential direction at a speed in a first speed range, which is a high speed, and at a speed in a second speed range, which is a low speed, according to a set speed.

When the base portion 110 operates at the speed in the first speed range, the chemical liquid is discharged to the outside, passing through gaps between the movable portions 143 in the process of being scattered after being jetted onto the substrate W. That is, the chemical liquid is discharged between piece-shaped members 1431 of the movable portion 140, which will be described below.

In addition, when the base portion 110 operates at the speed in the second speed range, the chemical liquid is discharged to pass through at least the body portion 142 and the base portion 110.

Referring to FIGS. 6 to 8, the movable portion 143 performs the variable movement that is based on rotation between an internal side and an outer side of the body portion 142. The rotation of the body portion 142 may be performed through hinge-coupling with the body portion 141 via, for example, a rotation module HP.

The movable portion 143 guides the chemical liquid scattered from the substrate W by performing the variable movement caused by the centrifugal force generated based on the rotational force of the base portion 110.

Here, the degree to which the chemical liquid is scattered from the substrate W is increased in response to the rotation speed of the base portion 110. Correspondingly, the degree of the variable movement of the movable portion 143 is increased in response to the rotation speed of the base portion 110.

The scattering prevention module 140 may suppress the eventual scattering of the chemical liquid beyond a set range by guiding the chemical liquid while increasing the degree of the variable movement. Here, the variable movement includes gradual or radical raising of the height of an upper side region of the scattering prevention module 140.

A subject that performs the variable movement in the scattering prevention module 140 corresponds to the movable portion 143 of the scattering prevent module 140. The movable portion 143 is formed in a shape rounded outwardly.

Here, the movable portion 143 is provided as a plurality of neighboring piece-shaped members 1431 on the body portion 142. Neighboring piece-shaped members 1431 of the movable portion 143 are arranged at least partially overlapping each other and perform the variable movement.

In this case, the first bowl 151 of the bowl 150 is located uppermost. The second bowl 150 of the bowl 150 is located having a first gap 151H with the first bowl 151. The third bowl 153 of the bowl 150 is located having a second gap 152H with the second bowl 152.

Meanwhile, the scattering prevention module 140 may allow the chemical liquid scattered from the substrate W to flow into one of the first gap 151H and the second gap 152H. The present disclosure is not limited thereto, and the chemical liquid may be guided to flow to a separate location other than the bowl 150.

In addition, although not separately shown, the scattering prevention module 140 may be provided at the position of the bowl 150 as a replacement of the bowl 150. In this case, the area of the base portion 110 may be expanded to reach the bowl 150.

Hereinafter, an apparatus for processing a substrate according to another embodiment of the present disclosure will be described based on the above description, yet with a focus on technical features.

Referring to FIGS. 9 and 10, the movable portion 143 includes a first movable member 1431, a second movable member 1432, and a third movable member 1433. Here, the first movable member 1431 of the movable portion 143 is directly interlocked with the base portion 110. The second movable member 1432 of the movable portion 143 is rotatably provided at an upper portion of the first movable member 1431 based on hinge-coupling with the first movable member 1431.

The first movable member 1431 and the second movable member 1432 are rotated in a foldable manner based on the centrifugal force and perform the variable movement. The bowl 150 is located in the peripheral portion of the base portion 110, and accommodates the chemical liquid scattered from the substrate W. The scattering prevention module 140 is located between the holding module 120 and the bowl 150.

Hereinafter, an apparatus for processing a substrate according to another embodiment of the present disclosure will be described based on the above description, yet with a focus on technical features.

Referring to FIG. 11, the first movable member 1431 of the movable portion 143 is directly interlocked with the base portion 110. The second movable member 1432 of the movable portion 143 is rotatably provided at an upper portion of the first movable member 1431 based on hinge-coupling with the first movable member 1431.

The first movable member 1431 and the second movable member 1432 are rotated in a foldable manner based on the centrifugal force and perform the variable movement.

The third movable member 1433 of the movable portion 142 is rotatably provided at an upper portion of the second movable member 1432 and performs the variable movement based on the centrifugal force in an analogous manner to that described above.

Referring to FIG. 12, a method S100 of processing a substrate according to an embodiment of the present disclosure includes placing a substrate (S110), jetting a chemical liquid (S120), and discharging the chemical liquid (S130).

In S110, a substrate W is placed on a holding module 120 located on a base portion 110. In S120, a chemical liquid is jetted onto the substrate W on the holding module 120 by a nozzle module 130 located above the base portion 110.

Then, in S130, a scattering prevention module 140 located on the base portion 110 at a peripheral portion of the holding module 120 guides the chemical liquid scattered from the substrate W to be discharged.

Here, the scattering prevention module 140 guides the scattered chemical liquid based on a variable movement from the internal side to the outer side caused by the centrifugal force due to rotation of the base portion 110.

According to an aspect of the present disclosure, there is provided an apparatus for processing a substrate including: a base portion configured to provide a rotational force in a circumferential direction; a holding module located on the base portion and configured to hold the substrate; a nozzle module located above the base portion and configured to jet a chemical liquid onto the substrate on the holding module; and a scattering prevention module located on the base portion at a peripheral portion of the holding module and configured to, when the chemical liquid is scattered after being jetted onto the substrate, guide the scattered chemical liquid to be discharged, wherein the scattering prevention module guides the scattered chemical liquid with a variable movement caused by the rotational force.

In addition, the scattering prevention module may include a support portion provided on the base portion, a body portion provided on the peripheral portion of the holding module via the support portion, and a movable portion provided at an upper portion of the body portion and configured to perform the variable movement.

In addition, the movable portion may perform the variable movement that is based on rotation between the internal side and the outer side of the body portion.

Also, the movable portion may guide the chemical liquid scattered from the substrate by performing the variable movement based on the centrifugal force.

In addition, the degree to which the chemical liquid is scattered from the substrate W may be increased in response to the rotation speed of the base portion, and the degree of the variable movement of the movable portion may be increased in response to the rotation speed of the base portion.

In addition, the movable portion of the scattering prevention module may be formed in a shape rounded outwardly.

In addition, the movable portion may include a first movable member directly interlocked with the base portion, and a second movable member rotatably provided at an upper portion of the first movable member and configured to perform the variable movement based on the centrifugal force.

In addition, the movable portion may include a third movable member rotatably provided at an upper portion of the second movable member and configured to perform the variable movement based on the centrifugal force.

In addition, the apparatus may further include a bowl located in the peripheral portion of the base portion and configured to accommodate the chemical liquid scattered from the substrate, and the scattering prevention module may be located between the holding module and the bowl.

In addition, the bowl may include a first bowl, a second bowl located having a first gap with the first bowl, and a third bowl located having a second gap with the second bowl, and the scattering prevention module may allow the chemical liquid scattered from the substrate to flow into one of the first gap and the second gap, or may guide the chemical liquid to flow to a separate location other than the bowl.

In addition, the movable portion may be provided as a plurality of neighboring piece-shaped members on the body portion.

In addition, the neighboring piece-shaped members of the movable portion may be arranged at least partially overlapping each other and perform the variable movement.

In addition, the support portion may be provided in plurality at a lower portion of the body portion and the chemical liquid guided by the movable portion may be discharged to pass through the body portion and the base portion.

According to another aspect of the present disclosure, there is provided an apparatus for processing a substrate including: a base portion capable of horizontal rotation; a holding module located on the base portion and configured to hold a substrate; a nozzle module located above the base portion and configured to jet a chemical liquid onto the substrate on the holding module; and a scattering prevention module located on the base portion at a peripheral portion of the holding module and configured to, when the chemical liquid is scattered after being jetted onto the substrate, guide the scattered chemical liquid to be discharged, wherein the scattering prevention module guides the chemical liquid with a variable movement caused by a centrifugal force due to the horizontal rotation, the scattering prevention module includes a support portion supported on the base portion, a body portion provided on the peripheral portion of the holding module via the support portion, and a movable portion provided at an upper portion of the body portion and configured to perform the variable movement, the movable portion suppresses guiding of the chemical liquid scattered from the substrate by performing the variable movement based on rotation between an internal side and an outer side of the body portion and the centrifugal force, wherein a degree to which the chemical liquid is scattered from the substrate is increased in response to a rotation speed of the base portion, a degree of the variable movement of the movable portion is increased in response to the rotation speed of the base portion, the movable portion is formed in a shape rounded outwardly, the movable portion further includes a first move member directly interlocked with the base portion and a second movable member rotatably provided at an upper portion of the first movable member and configured to perform the variable movement based on the centrifugal force, and the movable portion includes a third movable member rotatably provided at an upper portion of the second movable member and configured to perform the variable movement based on the centrifugal force.

According to another aspect of the present disclosure, there is provided a method of processing a substrate including: placing a substrate on a holding module located on a base portion; jetting, by a nozzle module located above the base portion, a chemical liquid onto the substrate on the holding module; guiding, by a scattering prevention module located on the base portion at a peripheral portion of the holding module, the chemical liquid scattered from the substrate to be discharged, wherein the scattering prevention module guides the scattered chemical liquid based on a variable movement from an internal side to an outer side caused by a centrifugal force due to rotation of the base portion.

While various embodiments have been described, those skilled in the art will appreciate that many variations and modifications can be made to the preferred embodiments without substantially departing from the principles of the present disclosure. Therefore, the disclosed preferred embodiments of the invention are used in a generic and descriptive sense only and not for purposes of limitation.

REFERENCE NUMERALS

110: BASE PORTION
120: HOLDING MODULE
130: NOZZLE MODULE
140: SCATTERING PREVENTION MODULE
141: SUPPORT PORTION
142: BODY PORTION
143: MOVABLE PORTION
150: BOWL
151: FIRST BOWL
152: SECOND BOWL
153: THIRD BOWL
HP: ROTATION MODULE

What is claimed:

1. An apparatus for processing a substrate, comprising:
a base portion configured to provide a rotational force in a circumferential direction;
a holding module located on the base portion and configured to hold the substrate;
a nozzle module located above the base portion and configured to jet a chemical liquid onto the substrate; and
a scattering prevention module located on the base portion at a peripheral portion of the holding module and comprising a body portion provided on the peripheral portion of the holding module and a movable portion provided at an upper portion of the body portion and configured to be movable inwardly or outwardly, the scattering prevention module configured to, when the chemical liquid is scattered after being jetted onto the substrate, guide the scattered chemical liquid to be discharged by a variable movement of the movable portion of the scattering prevention module being moved inwardly or outwardly by the rotational force.

2. The apparatus of claim 1, wherein the scattering prevention module comprises a support portion provided on the base portion and supporting the body portion.

3. The apparatus of claim 2, wherein the movable portion is configured to perform the variable movement that is based on rotation between the internal side and the outer side of the body portion.

4. The apparatus of claim 3, wherein the movable portion is configured to guide the chemical liquid scattered from the substrate by performing the variable movement based on the centrifugal force.

5. The apparatus of claim 4, wherein a degree to which the chemical liquid is scattered from the substrate is increased in response to the rotation speed of the base portion and a degree of the variable movement of the movable portion is increased in response to the rotation speed of the base portion.

6. The apparatus of claim 3, wherein the movable portion of the scattering prevention module is formed in a shape rounded outwardly.

7. The apparatus of claim 6, wherein the movable portion comprises a first movable member directly interlocked with the base portion and a second movable member rotatably provided at an upper portion of the first movable member and configured to perform the variable movement based on the centrifugal force.

8. The apparatus of claim 7, wherein the movable portion comprises a third movable member rotatably provided at an upper portion of the second movable member and configured to perform the variable movement based on the centrifugal force.

9. The apparatus of claim 3, further comprising a bowl located in the peripheral portion of the base portion and configured to accommodate the chemical liquid scattered from the substrate,
wherein the scattering prevention module is located between the holding module and the bowl.

10. The apparatus of claim 9, wherein the bowl comprises a first bowl, a second bowl having a first gap with the first bowl, and a third bowl having a second gap with the second bowl, and the scattering prevention module is configured to allow the chemical liquid scattered from the substrate to flow into one of the first gap and the second gap or is configured to guide the chemical liquid to flow to a separate location other than the bowl.

11. The apparatus of claim 2, wherein the movable portion is provided as a plurality of neighboring members on the body portion.

12. The apparatus of claim 11, wherein the neighboring members of the movable portion are arranged at least partially overlapping each other and perform the variable movement.

13. The apparatus of claim 2, wherein the support portion is provided in plurality at a lower portion of the body portion and the chemical liquid guided by the movable portion is discharged to pass through the body portion and the base portion.

14. An apparatus for processing a substrate, comprising:
a base portion capable of horizontal rotation;
a holding module located on the base portion and configured to hold a substrate;
a nozzle module located above the base portion and configured to jet a chemical liquid onto the substrate on the holding module; and
a scattering prevention module located on the base portion at a peripheral portion of the holding module and configured to, when the chemical liquid is scattered after being jetted onto the substrate, guide the scattered chemical liquid to be discharged by a variable movement of the scattering prevention module being moved inwardly or outwardly by a centrifugal force due to the horizontal rotation,
wherein:
the scattering prevention module includes a support portion supported on the base portion, a body portion provided on the peripheral portion of the holding module via the support portion, and a movable portion provided at an upper portion of the body portion and configured to be movable inwardly or outwardly to perform the variable movement,
the movable portion performs the variable movement based on rotation between an internal side and an outer side of the body portion and the centrifugal force, wherein a degree to which the chemical liquid is scattered from the substrate is increased in response to a rotation speed of the base portion,
a degree of the variable movement of the movable portion is increased in response to the rotation speed of the base portion,
the movable portion is formed in a shape rounded outwardly,
the movable portion further includes a first movable member directly interlocked with the base portion and a second movable member rotatably provided at an upper portion of the first movable member and configured to perform the variable movement based on the centrifugal force, and
the movable portion includes a third movable member rotatably provided at an upper portion of the second movable member and configured to perform the variable movement based on the centrifugal force.

15. The apparatus of claim 1, wherein the movable portion of the scattering prevention module is configured to be movable inwardly or outwardly by the rotational force of the base portion such that a height of the scattering prevention module is changeable depending on the variable movement of the movable portion of the scattering prevention module being moved inwardly or outwardly.

16. The apparatus of claim 14, wherein the movable portion of the scattering prevention module is configured to be movable inwardly or outwardly by the rotational force of the base portion such that a height of the scattering prevention module is changeable depending on the variable movement of the movable portion of the scattering prevention module being moved inwardly or outwardly.

* * * * *